US010579745B2

(12) United States Patent
Das et al.

(10) Patent No.: US 10,579,745 B2
(45) Date of Patent: Mar. 3, 2020

(54) MODEL DRIVEN COMPUTATIONAL PLATFORM FOR INTEGRATED DESIGN OF PRODUCTS, MATERIALS AND MANUFACTURING PROCESSES

(71) Applicant: Tata Consultancy Services Limited, Mumbai (IN)

(72) Inventors: Prasenjit Das, Pune (IN); Raghavendra Reddy Yeddula, Pune (IN); Sapankumar Hiteshchandra Shah, Pune (IN); Sreedhar S Reddy, Pune (IN); Gautham Purushottham Basavarsu, Pune (IN); Amarendra Kumar Singh, Pune (IN); Avadhut Sardeshmukh, Pune (IN)

(73) Assignee: Tata Consultancy Services Limited, Mumbai (IN)

( * ) Notice: Subject to any disclaimer, the term of this patent is extended or adjusted under 35 U.S.C. 154(b) by 435 days.

(21) Appl. No.: 15/117,309

(22) PCT Filed: Apr. 24, 2015

(86) PCT No.: PCT/IB2015/052994
§ 371 (c)(1),
(2) Date: Aug. 8, 2016

(87) PCT Pub. No.: WO2015/162592
PCT Pub. Date: Oct. 29, 2015

(65) Prior Publication Data
US 2017/0039298 A1 Feb. 9, 2017

(30) Foreign Application Priority Data

Apr. 25, 2014 (IN) .......................... 1472/MUM/2014

(51) Int. Cl.
*G06F 17/50* (2006.01)
*G05B 13/04* (2006.01)
*G05B 17/02* (2006.01)

(52) U.S. Cl.
CPC .......... *G06F 17/50* (2013.01); *G05B 13/041* (2013.01); *G05B 17/02* (2013.01); *G06F 17/5009* (2013.01)

(58) Field of Classification Search
CPC ... G06F 17/50; G06F 17/5009; G05B 13/041; G05B 17/02
(Continued)

(56) References Cited

U.S. PATENT DOCUMENTS 8,285,522 B1* 10/2012 Tryon, III ........... G06F 17/5009
702/34
9,053,260 B2* 6/2015 Romatier ............... G05B 17/02
(Continued)

FOREIGN PATENT DOCUMENTS

WO WO 2013/149206 10/2013

OTHER PUBLICATIONS

Deepak Kumar, "Using the Software Adapter to Connec tLegacy Simulation Model to the RTI", 2006, University of Central Florida (Year: 2006).*
(Continued)

*Primary Examiner* — Kamini S Shah
*Assistant Examiner* — Faraj Ayoub
(74) *Attorney, Agent, or Firm* — Finnegan, Henderson, Farabow, Garrett & Dunner LLP (57) ABSTRACT

The method(s) and system(s) for implementing extensibility of computational design and modelling of subject area on a computational platform in respect of a new subject in a subject area through a modelling schema includes populating the new subject in the model repository as data elements
(Continued)

corresponding to the domain entity model of the domain entity meta model. The method includes generating a subject integration layer and a subject information interaction layer from the populated subject data elements and generating GUI screens for user interactions from the populated subject data elements. The method, further, includes integrating user determined external simulation tools with the computational platform by mapping the user determined external simulation tool parameters to the subject data elements. Subsequently, the method includes generating simulation tool adapters from said mapping to achieve said integration.

11 Claims, 6 Drawing Sheets

(58) Field of Classification Search
USPC .............................................................. 703/3
See application file for complete search history.

(56) References Cited

U.S. PATENT DOCUMENTS

| 2002/0107673 | A1* | 8/2002 | Haller .............. G05B 19/41805 |
| | | | 703/1 |
| 2003/0208505 | A1* | 11/2003 | Mullins ................. G06F 16/289 |
| 2010/0030525 | A1 | 2/2010 | Dong et al. |
| 2011/0208788 | A1 | 8/2011 | Heller et al. |
| 2013/0262055 | A1* | 10/2013 | Webber .............. G06F 17/5009 |
| | | | 703/2 |

OTHER PUBLICATIONS

Birrer, I., et al., "EODiSP—An Open and Distributed Simulation Platform", 9$^{th}$ International Workshop on Simulation for European Space Programmes, P&P Software, 10 pages, Nov. 2006.

* cited by examiner

MODEL DRIVEN COMPUTATIONAL PLATFORM FOR INTEGRATED DESIGN OF PRODUCTS, MATERIALS AND MANUFACTURING PROCESSES

PRIORITY CLAIM

This U.S. patent application is a national stage application of international application PCT/IB2015/052994 filed on Apr. 24, 2015, which claims priority benefit of Indian Application No. 1472/MUM/2014, filed on Apr. 25, 2014. The entire content of the aforementioned application are incorporated herein by reference.

TECHNICAL FIELD

The present invention relates to the field of a computational platform for integrated design of materials and products and, particularly but not exclusively, to methods and systems for manufacturing design and development of materials, manufacturing processes and products on a computational platform.

Definitions of Terms Used in the Complete Specification

The expression 'extensibility' used hereinafter in this specification refers to extending the capabilities of the computational platform whereby support for new materials, products, processes, and simulation models can be easily added without having to hardwire them into the computational platform.

The expression 'modelling schema' used hereinafter in this specification refers to the relationship between the domain entity meta model and domain entity model and the context in which they may be used for model database.

The expression 'view model' used hereinafter in this specification refers to a framework which defines a coherent set of views to be used in the construction of a system architecture, or enterprise architecture. In the context of the present specification, a view refers to an instance of a data structure that communicates with an interface.

The expression 'global state' used hereinafter in this specification refers to a set of data elements that describe the state of the design elements of the design problems that are being solved on the platform at any given point in time. In the context of the present specification, a design element may be a product, a material or a manufacturing process.

These definitions are in addition to those expressed in the art.

BACKGROUND

Manufacturing processes consist of a large number of complexities. These complexities vary from setting of bill of materials to different material handling and processing techniques. These complexities pose logistics and engineering challenges. Some of these challenges include maintaining records of changing engineering designs, information disconnection between the different manufacturing shops and costs incurred in tests and trials. With increasing competition and changing customer needs, the time cycle for product design and development needs to be reduced. Manufacturers are looking for ways to save on manufacturing costs while accelerating product lifecycle management cycles.

A method relating to computational design and modeling is disclosed in Indian Patent Application No. 3456/MUM/2012, filed on Dec. 5, 2012, which is incorporated by reference herein in its entirety. In the platforms area, extensibility is viewed as a plug-n-play integration of components through integration architecture such as a service oriented architecture. In such cases a new component is integrated into the platform by registering its interface with the integration bus provided by the platform. Other components in this platform interact with a new component by using its interface. But, the implementation of the component remains a black box to the other components. Such kind of extensibility is good for a large class of applications but is inadequate for the needs of a platform that supports integrated design of materials, products and manufacturing processes with a strong knowledge engineering and machine learning capability. In such a platform there should be a provision to add support for new materials, products and manufacturing processes seamlessly. Models of materials, components and manufacturing processes should not be black boxes. These models have to be visible to other core components of the platform so that they can be handled in an integrated manner. Knowledge services need to know the ontology elements in terms of which knowledge is expressed. Similarly a data mining component needs to have access to domain model elements in order to interpret data correctly and to place the results in a correct context. An architecture is needed where these models are first class entities in the platform.

Hence, there is a need for a platform that limits the aforementioned drawbacks and integrates elements such as designs of materials, products and manufacturing processes, along with other existing elements in the platform.

OBJECTIVES OF THE INVENTION

Some of the objectives of the framework of the present invention are aimed to ameliorate one or more problems of the prior art or to at least provide a useful alternative and are listed herein below.

An objective of the present disclosure is to provide a model driven computational platform for integrated design of materials, products and their manufacturing processes which accelerates the development of new engineering solutions.

Another objective of the present disclosure is to provide a model driven computational platform for integrated design of materials, products and their manufacturing processes which limits the disadvantages associated with non-model based implementation techniques.

Yet another objective of the present disclosure is to provide a model driven computational platform for integrated design of materials, products and their manufacturing processes which provides the freedom to add support for new materials, products and manufacturing processes.

Other objectives and advantages of the present disclosure will be more apparent from the following description when read in conjunction with the accompanying figures, which are not intended to limit the scope of the present disclosure.

SUMMARY

This summary is provided to introduce concepts related to a model driven computational platform for integrated design of materials, products and their manufacturing processes. This summary is neither intended to identify essential features of the claimed subject matter nor is it intended for use in determining or limiting the scope of the present disclosure.

In an embodiment, method(s) and system(s) for implementing extensibility of computational design and modelling on a computational platform in respect of a new subject in a subject area through a modelling schema. The method includes populating the new subject in a model repository as data elements corresponding to a domain entity model of a domain entity meta model. The method includes generating a subject integration layer and a subject information interaction layer from the populated subject data elements. Further, the method includes generating GUI screens for user interactions from the populated subject data elements. Further, the method includes integrating user determined external simulation tools with the computational platform by mapping the user determined external simulation tool parameters to the subject data elements. To this end, the method includes generating simulation tool adapters from the mapping to achieve the integration, thereby achieving the extensibility in respect of the new subject in the subject area on the computational platform.

In another embodiment, a non-transitory computer readable medium embodying a program executable in a computing device for executing a method for implementing extensibility of computational design and modelling of subject areas on a computational platform in respect of a new subject in a subject area through a modelling schema is disclosed. The modelling schema includes a domain entity meta model corresponding to each subject area, a domain entity model corresponding to each subject in a subject area, a domain entity instance meta model corresponding to instances of subjects of a subject area, and a domain entity instance model corresponding to an instance of a subject in a subject area. The program comprises a program code for populating the new subject in a model repository as data elements corresponding to the domain entity model of the domain entity meta model. The program comprises a program code for generating a subject integration layer and a subject information interaction layer from the populated subject data elements. The program comprises a program code for generating GUI screens for user interactions from the populated subject data elements. The program comprises a program code for integrating user determined external simulation tools with the computational platform by mapping the user determined external simulation tool parameters to the subject data elements. The program comprises a program code for generating simulation tool adapters from said mapping to achieve said integration, thereby achieving the extensibility in respect of the new subject in the subject area on the computational platform.

BRIEF DESCRIPTION OF ACCOMPANYING DRAWINGS

The detailed description is described with reference to the accompanying figures. In the figures, the left-most digit(s) of a reference number identifies the figure in which the reference number first appears. The same numbers are used throughout the drawings to reference like features and modules.

It should be appreciated by those skilled in the art that any block diagrams herein represent conceptual views of illustrative systems embodying the principles of the present subject matter. Similarly, it will be appreciated that any flow charts, flow diagrams, and the like represent various processes which may be substantially represented in computer readable medium and so executed by a computer or processor, whether or not such computer or processor is explicitly shown.

DETAILED DESCRIPTION

Some of the drawbacks of the traditional system of handling the complexities in the management, engineering and manufacturing processes include the large amount of time and resources required to manage the product lifecycle as well as control the variability in the manufacturing processes across the breadth of the manufacturing plant. These drawbacks are encouraging the manufactures to opt for computer based solutions which could largely save their costs and accelerate development. The present disclosure introduces such a platform which virtualizes the engineering and management of product design and development.

Further, in the conventional system which is disclosed as a reference in Indian Patent Application No. 3456/MUM/2012, the domain entity model is derived for a specific problem or a class of problems, and determined at development time. Furthermore, the problem specific logic is encoded at development time. Thus, the scope for a user is limited to solve a specific class of problems for which required logical artifacts had been developed and bundled with the deployment of the system. Furthermore, the user is only able to create or modify the relevant design processes specific to these problems. But in that sense, the user is restricted to use in-built artifacts such as programming logic embedded in predefined services, rules, user input screens, etc. When the user defined design process is executed, the runtime data is thereafter stored in predefined tables developed during modeling of the domain entity model. As there is no commonality or standardization of the structure of data, it is not possible to dynamically relate the solution of one problem to another. For example, consider two separate class of problems related to design of Gear and Clutch for an automobile. To solve these two classes, Gear and Clutch specific models and other artifacts are created by the developers of the platform and an executable is created. The user may independently solve the specific problems using the in-built artifacts. But the user can not combine these two solutions and infer some common elements. Combining these two would again require developer involvement. The developer needs to know the commonality in advance to create specific solutions to handle such a situation.

The modeling scheme of the present disclosure addresses these concerns by generalizing the problem domain. The problem domain is described in terms of the Domain Entity Meta Model. A specific Domain Entity Model is an instance of the Domain Entity Meta Model. Both Gear and Clutch in the previous example are modeled as instances of the predefined element "component" which is a member of the Domain Entity Meta Model. The user is, therefore, able to define the Domain Entity Model for the specific problem.

Further, a development environment is also available to the user where the user defines specific logic in terms of the Domain Entity Model. To this end, the user need not rely on in-built artifacts to solve specific problems. Since the Domain Entity Meta Model provides common language in terms of which Domain Entity Models (e.g. Gear and Clutch models) are expressed, therefore, the relationship is established between them. The common language also plays a major role in developing generic utilities such as screen designers, simulation tool adapters, and the like to automate the functions of GUI screen generation and simulation tool integration. Without such information, screens may have to be implemented independently for each Domain Entity Model. Similarly integration of Simulation Tools may have to be implemented independently for each Domain Entity Model.

Furthermore, the runtime data generated during the execution of user defined logics on user defined models is stored in generic structures. The generated data conforms to the user defined Domain Entity Model and the predefined Domain Entity Instance Meta Model. As the data structure becomes generic, it is possible to easily combine solutions of two different problems and identify the commonality between them.

The present invention relates to a system and a method for implementing extensibility of computational design and modelling of subject area on a computational platform in respect of a new subject in a subject area through a modelling schema.

Unless specifically stated otherwise, as apparent from the following discussions, it is to be appreciated that throughout the present disclosure, discussions utilizing terms such as "populating" or "generating" or "integrating" or "mapping" or "achieving" or the like, refer to the action and processes of a computer system, or similar electronic activity detection device, that manipulates and transforms data represented as physical (electronic) quantities within the computer system's registers and memories into other data similarly represented as physical quantities within the computer system memories or registers or other such information storage, transmission or display devices.

The systems and methods are not limited to the specific embodiments described herein. In addition, modules of each system and each method can be practiced independently and separately from other modules and methods described herein. Each module and method can be used in combination with other modules and other methods.

According to an implementation, the present invention discloses a system and method for implementing extensibility of computational design and modelling of subject area on a computational platform in respect of a new subject in a subject area through a modelling schema.

The model driven computational platform of the present disclosure implemented on computer system is having a processing unit, a memory and a model repository. The model driven computational platform may be implemented for extensibility of computational design and modelling of subject area in respect of a new subject in a subject area. The subject area may include components, materials, manufacturing processes, phenomenon and simulation model. The new subject may include instances of the subject area including components, materials, manufacturing processes, phenomenon and simulation model. Further, the model driven computational platform implementation may be achieved through a modelling schema.

The modelling schema may include a domain entity meta model corresponding to each subject area, a domain entity model corresponding to each subject in a subject area, a domain entity instance meta model corresponding to instances of subjects of a subject area, and a domain entity instance model corresponding to an instance of a subject in a subject area. Further, the domain entity meta model specifies the general structure of the entities in the subject area. The general structure of the entities may define the structure required for specifying any component of interest, for example, a component's part, features (geometric or functional), requirements, constraints, etc. Further, the domain entity model specifies a specific domain entity as an instance of the domain entity meta model, for example, the model of a specific component such as Gear as an instance of the component meta model. Furthermore, the domain entity instance meta model specifies the general structure of entity instances in the subject area, for example, the component instance meta model, which defines the structure required for specifying any component instance of interest, i.e. a specific gear under design. In this respect, an entity instance may have to conform to the specification of the corresponding entity, therefore there may be a specification relationship between the domain entity instance meta model and the domain entity meta model. Further, the domain entity instance model specifies instances of the domain entities of the domain entity model, may be stored in terms of the structure specified by the domain entity instance meta model. For example, a specific gear under design conforming to the gear component model.

According to the present implementation, the method for implementing extensibility of computational design and modelling of subject area on a computational platform in respect of a new subject in a subject area through a modelling schema includes populating the new subject in the model repository as data elements corresponding to the domain entity model of the domain entity meta model. Further, the method includes generating a subject integration layer and a subject information interaction layer from the populated subject data elements and generating GUI screens for user interactions from the populated subject data elements. To this end, the method includes integrating user determined external simulation tools with the computational platform by mapping the user determined external simulation tool parameters to the subject data elements. Subsequently, the method includes generating simulation tool adapters from said mapping to achieve said integration, thereby achieving the extensibility in respect of the new subject in the subject area on the computational platform.

In another implementation, the model driven method includes generating a subject integration layer and a subject information interaction layer from the populated subject data elements. The subject integration layer may include an interface of the subject with the computational platform. In this respect, the interface of the subject, including the instances of components, materials, manufacturing processes, phenomenon, and simulation tool, provides a constraint where the feature value and the feature may only be associated when the corresponding component instances and the component are associated. Further, the subject information interaction layer may include database schema, object relational mapping, transaction management, and cache management.

In another implementation, the model driven method includes generating GUI screens for user interactions from the populated subject data elements. In this respect, the GUI screens generation is based on a view model, a mapping between the view model and screen elements, a mapping between the view model and a platform service messages, and the set of rendering rules to identify the screen elements from the domain entities and platform services. Further, the GUI screens may also be generated, automatically, using a set of rendering rules stored in the memory, that identify appropriate screen elements given the global state ontology elements and services. For example, the rendering rules may specify 'Parameter' objects that may be rendered using Text Boxes, and Services may be invoked on Button click. Therefore, by using these rules, the view model, screen elements and appropriate mappings may be, automatically, generated.

For example, a service that takes Heating Rate and Temperature as input for a tempering process and updates the corresponding elements in the global state, a GUI screen can be automatically generated for the service. The generated screen with two input text boxes will be created for specification of the parameters, one button will be created to invoke the service, view model will contain elements to represent the two parameters and the service, view model elements will be mapped to input text boxes and button available in the screen and view model elements will be mapped to the global state elements representing the parameters and to the service.

In another implementation, the model driven method includes integrating user determined external simulation tools with the computational platform by mapping the user determined external simulation tool parameters to the subject data elements, and further, generating simulation tool adapters from the above mapping to achieve the integration. In this respect, the generated simulation tools adapters read data from the model elements in the global state ontology and prepares inputs in a user defined format of the external simulation tools. Subsequently, the generated simulation tools adapters read output generated by the external simulation tools and populate the model elements in the global state ontology.

Throughout the description and claims of this complete specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

For a firmware and/or software implementation, the methodologies can be implemented with modules (e.g., procedures, functions, and so on) that perform the functions described herein. Any machine readable medium tangibly embodying instructions can be used in implementing the methodologies described herein. For example, software codes and programs can be stored in a memory and executed by a processor.

In another firmware and/or software implementation, the functions may be stored as one or more instructions or code on a non-transitory computer-readable medium. Examples include computer-readable media encoded with a data structure and computer-readable media encoded with a computer program. The computer-readable media may take the form of an article of manufacturer. The computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk, and Blue-ray disc where disks usually reproduce data magnetically, while discs reproduce data optically with lasers. Combinations of the above should also be included within the scope of computer-readable media.

It should be noted that the description merely illustrates the principles of the present subject matter. It will thus be appreciated that those skilled in the art will be able to devise various arrangements that, although not explicitly described herein, embody the principles of the present subject matter and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The manner, in which the model driven computational platform for integrated design of materials, manufacturing processes and products shall be implemented, has been explained in details with respect to the FIGS. 1, 2, 3 and 4.

Figure 1:
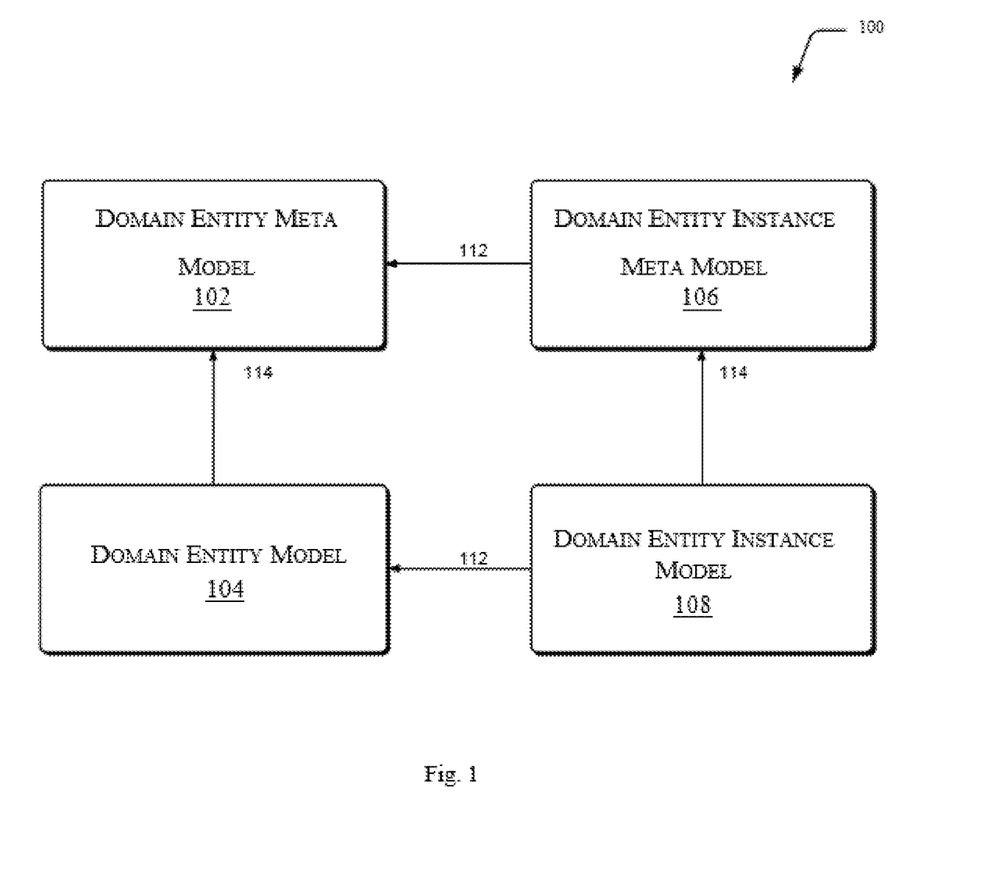
FIG. 1 illustrates a block diagram of a modelling schema, according to an implementation of the present disclosure.

FIG. 1 illustrates a block diagram of a modelling schema 100 in the present invention. The modelling schema may further be represented with the numeral 100. The main components of the schema are Domain Entity Meta-model 102, Domain Entity Model 104, Domain Entity Instance Meta-model 106 and Domain Entity Instance Model 108. The instance model and the instance meta-model are specified by 112 meta-model and model respectively. Whereas the entity model and the entity instance model are instances of 114 entity met-model and the entity instance meta-model respectively. The present invention provides a model driven engineering capability that significantly accelerates the development of new engineering solutions on the platform. It provides a modelling infrastructure whereby a significant part of the solution can be specified in terms of models.

As illustrated by FIG. 1, the domain model of the present invention is organized along subject areas such as material, component, process (manufacturing and testing), phenomenon, simulation models, etc. The domain models of these subject areas are organized as per the schema shown in FIG. 1. The Domain Entity Meta-model 102 specifies the general structure of the entities in the subject area. E.g. the component meta-model, which defines the structure required for specifying any component of interest (e.g. a component's parts, features (geometric, functional), requirements, constraints, etc.). The Domain Entity Model 104 specifies the model of a specific domain entity as an instance of the domain entity meta-model 102 (e.g. the model of a specific component such as gear as an instance of the component meta model). The Domain Entity Instance Meta Model 106 specifies the general structure of entity instances in the subject area. (e.g. the component instance meta-model, which defines the structure required for specifying any component instance of interest similar to a specific gear under design). An entity instance should conform to the specification of the corresponding entity, thus there is a specification relationship between the domain entity instance meta-model 106 and the domain entity meta-model 102. The Domain Entity Instance Model 108 specified in the domain entity model 104, stored in terms of the structure specified by the domain entity instance meta model 106. For example, a specific gear under design conforming to the gear component model.

The component meta-model specifies two entities, a component entity that has one or more associated feature entities. The component instance meta-model specifies that a component instance has one or more feature values, and that a component instance must have an associated component and a feature value must have an associated feature; and a constraint that the feature value and the feature can only be associated when the corresponding component instance and the component are associated. An example model of a component 'Gear' is considered as an example of an instance of the component meta-model.

Figure 2:
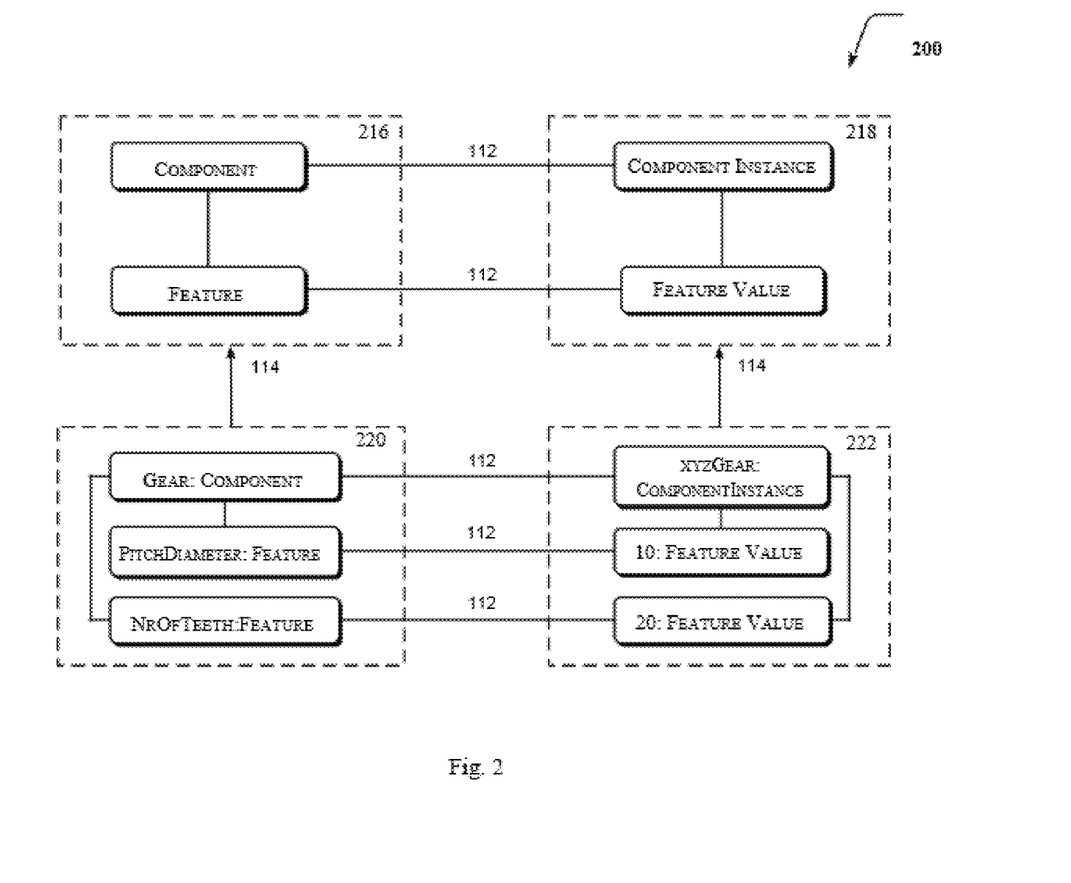
FIG. 2 illustrates a block diagram of a sample model, according to an implementation of the present disclosure.

FIG. 2 illustrates an embodiment of the modeling schema for a small fragment of the subject area 'Component'. The models in the lower half of FIG. 2 show how a specific component called 'Gear' is instantiated using these meta-models. The four main blocks housing the schema for the instantiated gear include the component meta-model block 216, component instance meta-model block 218, a gear model block 220 and a tempering process instance block 222. First a model of Gear as an instance of the component meta-model is created; in this the component entity 'Gear' as an instance of the meta entity 'Component', and feature entities 'PitchDiameter' and 'NrOfTeeth' as instances of the meta entity 'Feature' and associated them with 'Gear' are created. Once the Gear model is created, any number of gear instances is set.

Further, FIG. 2 shows one sample instance in the lower right corner. The instance has feature values '10' and '20' for features 'PitchDiameter' (units omitted for simplicity) and 'NrOfTeeth' respectively. The interpreter of a subject area encodes the semantics of the corresponding entity and entity instance meta-models. Once these are in place, to build support for a new component, material, manufacturing process, a suitable instance of the corresponding meta-model are populated.

Figure 4:
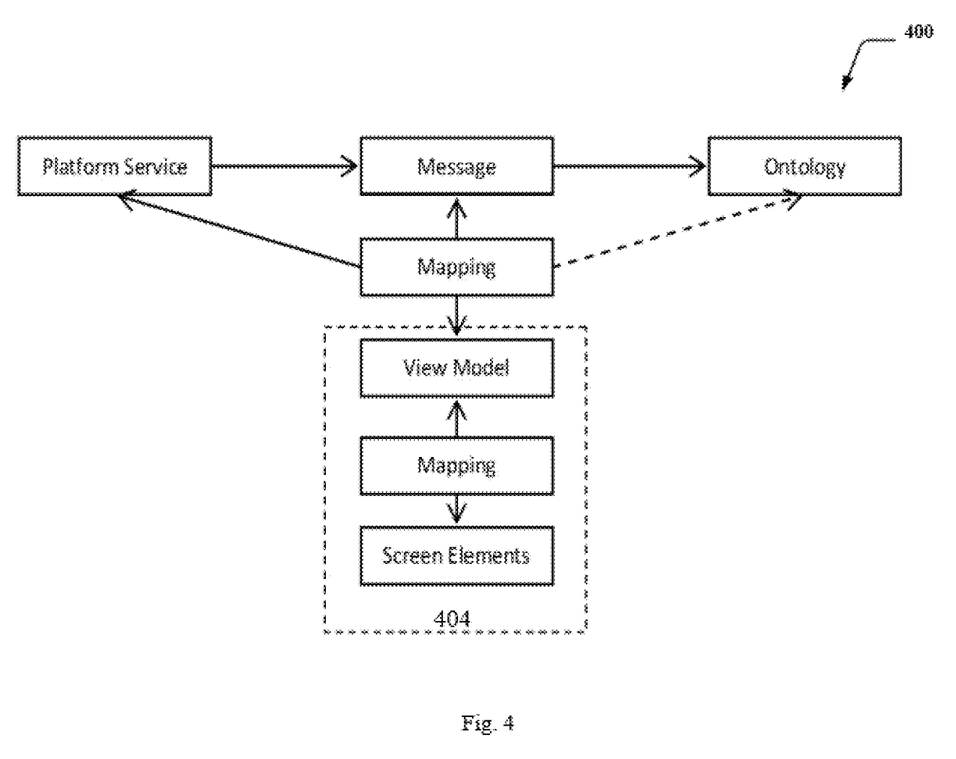
FIG. 4 illustrates a block diagram of a model driven approach to GUI screens, according to an implementation of the present disclosure.

Further, building a new engineering solution involves several things in addition to populating models such as building adapters to integrate any new simulation tools that are required, building GUI screens (404) required for user interaction while carrying out design processes and populating the repository with required knowledge and knowledge services.

Figure 3:
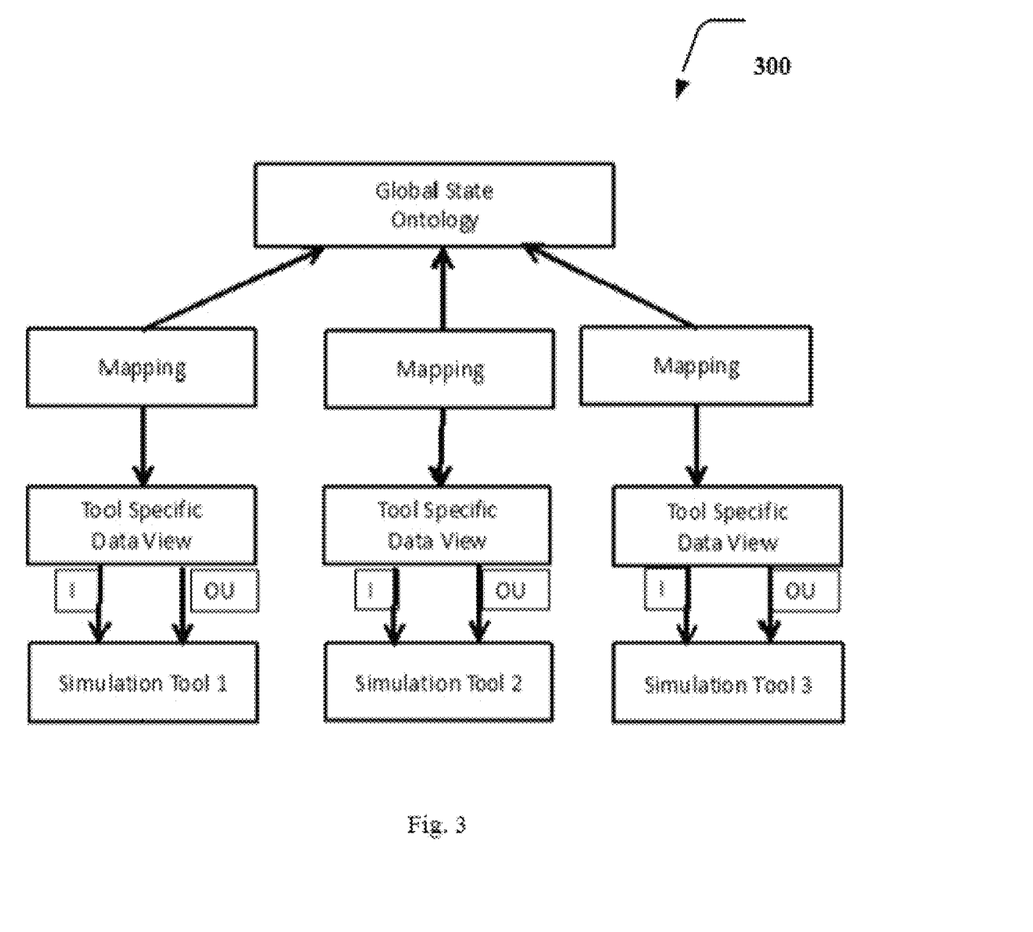
FIG. 3 illustrates a block diagram of a model driven approach to simulation tool interfaces, according to an implementation of the present disclosure.

Simulation tool adapters using model driven techniques are generated as provided through 300. Each simulation tool has its own data view. Tool specific data views to domain entity and domain instance models that can provide the information required by these data views, as illustrated in FIG. 3, are mapped. For example, to simulate heat transfer phenomenon in the tempering process of a gear component, the simulation tool input and output specifications to requisite elements in the tempering process model, heat transfer phenomenon model, gear component model (especially the geometry part), material model, and so on are mapped. From these mapping specifications, a tool specific adapter is automatically generated. The adapter reads data from the specified model elements in the global state, and prepares the input in the format required by the simulation tool. After the simulation tool completes its execution, it reads the output generated by the tool and populates the specified model elements in the global state.

Further, GUI screens required for user interaction using model driven techniques are generated. The screens get their data from the model elements in global state, and populate model elements in the global state. The data views of the screens are encoded using screen specific view models. The screen elements are mapped to view model elements. There is two-way synchronization between the screen and the view model. Whenever view model changes, the screen is updated and whenever user specifies some values in screen controls, the view model is updated. The interaction between the screens and the global state is performed through PREMAP platform services. View model elements are mapped to services and service messages. Service messages are defined using global state ontology elements. This means, view model is also mapped to global state ontology elements. Input messages for the services are constructed from the mapped view model elements. The view model is updated in response to the output messages.

FIG. 4 illustrates the relations 400 between services, global state ontology, view model and the screen. From these models, GUI screen implementations are automatically generated. HTML and JavaScript code are generated from the models. HTML is used to represent Screen Elements and JavaScript is used to encode View Model. The JavaScript code of the View Model invoke PREMAP Platform Services which are exposed through REST (REpresentational State Transfer) based service interfaces. All the data that is transferred between the platform and the screens are encoded in JSON (JavaScript Object Notation) format.

Further, GUI screens can also be automatically generated using a set of rendering rules that identify appropriate screen elements given the global state ontology elements and services. For example, rules that specify 'Parameter' objects should be rendered using Text Boxes, and Services should be invoked on Button click. Using these rules, the view model, screen elements and appropriate mappings can be automatically generated.

For example, a service that takes Heating Rate and Temperature as input for a tempering process and updates the corresponding elements in the global state, a GUI screen can be automatically generated for the service. The generated screen with two input text boxes will be created for specification of the parameters, one button will be created to invoke the service, view model will contain elements to represent the two parameters and the service, view model elements will be mapped to input text boxes and button available in the screen and view model elements will be mapped to the global state elements representing the parameters and to the service.

Figure 5:
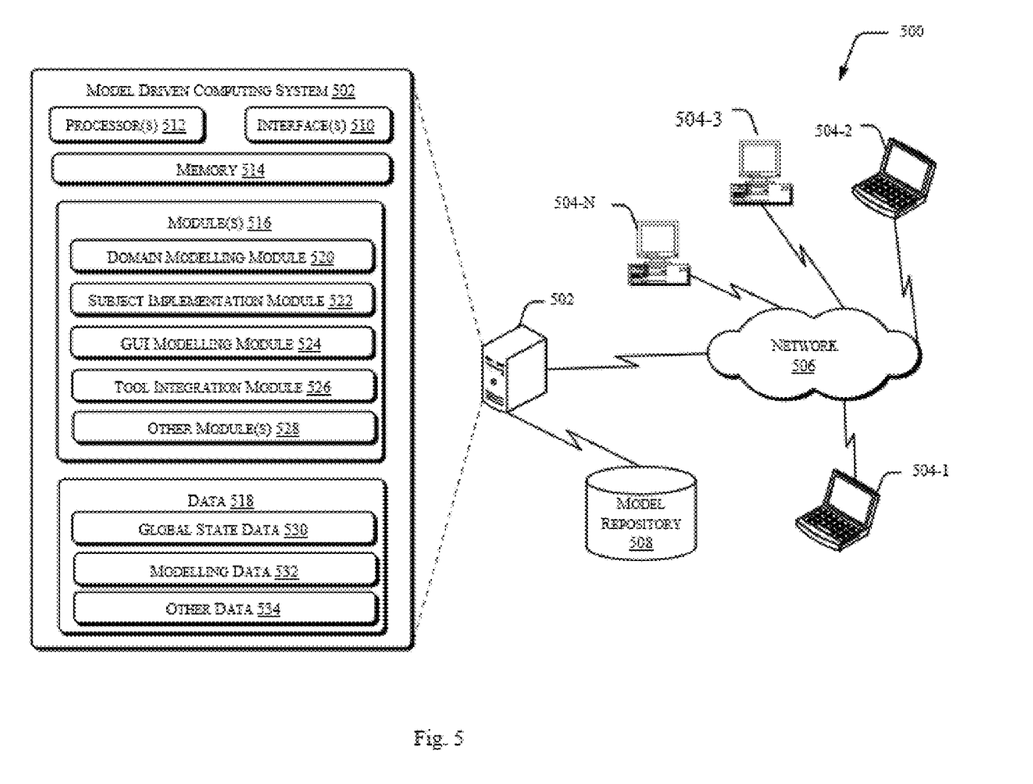
FIG. 5 illustrates a network environment implementing a model driven computing system for implementing extensibility of computational design and modelling of subject area on a computational platform in respect of a new subject in a subject area through a modelling schema, according to an implementation of the present disclosure.

FIG. 5 illustrates a network 500 implementing a model driven computing system 502 for implementing extensibility of computational design and modelling of subject area on a computational platform in respect of a new subject in a subject area through a modelling schema. The model driven computing system 502 can be implemented as a variety of communication devices, such as a laptop computer, a notebook, a workstation, a mainframe computer, a server and the like. The model driven computing system 502 described herein, can also be implemented in any network environment comprising a variety of network devices, including routers, bridges, servers, computing devices, storage devices, etc.

In one implementation, the model driven computing system 502 is connected to one or more computing devices 504-1, 504-2 . . . 504-N, individually and commonly hereinafter referred to as device(s) 504, and a model repository 508, through a network 506. The devices 504 may be implemented as, but are not limited to, hand-held devices, laptops or other portable computers, tablet computers, mobile phones, personal digital assistants (PDAs), Smartphone, and the like. The devices 504 may be located within the vicinity of the model driven computing system 502 or may be located at different geographic location as compared to that of the model driven computing system 502. Further, the devices 504 may themselves be located either within the vicinity of each other, or may be located at different geographic locations.

The network 506 may be a wireless or a wired network, or a combination thereof. The network 506 can be a collection of individual networks, interconnected with each other and functioning as a single large network (e.g., the internet or an intranet). The network 506 can be implemented as one of the different types of networks, such as intranet, local area network (LAN), wide area network (WAN), the internet, and such. The network 506 may either be a dedicated network or a shared network, which represents an association of the different types of networks that use a variety of protocols, for example, Hypertext Transfer Protocol (HTTP), Transmission Control Protocol/Internet Protocol (TCP/IP), etc., to communicate with each other.

The model repository 508 may be implemented as, but not limited to, enterprise database, remote database, local database, and the like. The model repository 508 may be located within the vicinity of the model driven computing system 502 and devices 504 or may be located at different geographic location as compared to that of the model driven computing system 502 and devices 504. Further, the model repository 508 may themselves be located either within the vicinity of each other, or may be located at different geographic locations. Furthermore, the model repository 508 may be implemented inside the device 504 or inside the model driven computing system 502 and the model repository 508 may be implemented as a single database.

In one implementation, the model driven computing system 502 includes processor(s) 512. The processor 512 may be implemented as one or more microprocessors, microcomputers, microcontrollers, digital signal processors, central processing units, state machines, logic circuitries, and/or any devices that manipulate signals based on operational instructions. Among other capabilities, the processor(s) is configured to fetch and execute computer-readable instructions stored in a memory.

The functions of the various elements shown in the FIG. 5, including any functional blocks labelled as "processor(s)", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), non-volatile storage. Other hardware, conventional and/or custom, may also be included.

Also, the model driven computing system 502 includes interface(s) 510. The interfaces 510 may include a variety of software and hardware interfaces that allow the model driven computing system 502 to interact with the entities of the network 506, or with each other. The interfaces 510 may facilitate multiple communications within a wide variety of networks and protocol types, including wire networks, for example, LAN, cable, etc., and wireless networks, for example, WLAN, cellular, satellite-based network, etc.

The model driven computing system 502 may also include a memory 514. The memory 514 may be coupled to the processor 512. The memory 514 can include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes.

Further, the model driven computing system 502 may include module(s) 516 and data 518. The modules 516 may be coupled to the processors 512 and amongst other things, include routines, programs, objects, components, data structures, etc., which perform particular tasks or implement particular abstract data types. The modules 516 may also be implemented as, signal processor(s), state machine(s), logic circuitries, and/or any other device or component that manipulate signals based on operational instructions. Further, the modules 516 can be implemented in hardware, instructions executed by a processing unit/processor, or by a combination thereof. In another aspect of the present subject matter, the modules 516 may be machine-readable instructions (software) which, when executed by a processor/processing unit, perform any of the described functionalities.

In an implementation, the modules 516 may include a domain modelling module 520, a subject implementation module 522, a GUI modelling module 524, a tool integration module 526, and other module(s) 528. The other module(s) 528 may include programs or coded instructions that supplement applications or functions performed by the model driven computing system 502. Further, the data 518 may include global state data 530, modelling data 532, and other data 534. The other data 534, amongst other things, may serve as a repository for storing data that is processed, received, or generated as a result of the execution of one or more modules in the modules 516. Although the data 518 is shown internal to the model driven computing system 502, it may be understood that the data 518 can reside in an external repository, which may be coupled to the model driven computing system 502.

In one implementation, the model driven computing system 502 implemented for extensibility of computational design and modelling of subject area in respect of a new subject in a subject area. The subject area may include components, materials, manufacturing processes, phenomenon and simulation model. The new subject may include instances of the subject area including components, materials, manufacturing processes, phenomenon and simulation model. Further, the model driven computing system 502 may be implemented on a computational platform through a modelling schema 100.

The model driven computing system 502 may include the domain modelling module 520 to define the new subject in the model repository 508 by populating data elements corresponding to the domain entity model 104 of the domain entity meta model 102. Further, the model driven computing system 502 may include the subject implementation module 522 to generate a subject integration layer and a subject information interaction layer from the populated subject data elements. Furthermore, the model driven computing system 502 may include the GUI modelling module 524 to generate GUI screens, based on rendering rules stored in said memory, for user interactions from the populated subject data elements. The model driven computing system 502 may further, include the tool integration module 526 to integrate user determined external simulation tools with the computational platform by mapping the user determined external simulation tool parameters to the subject data elements and generate simulation tool adapters from the above mapping to achieve the integration, thereby achieve the extensibility in respect of the new subject in the subject area on the computational platform.

According to the present implementation, the model driven computing system 502 may be implemented on the computational platform through the modelling schema 100 which include the domain entity meta model 102 corresponding to each subject area, the domain entity model 104 corresponding to each subject in a subject area, a domain entity instance meta model 106 corresponding to instances of subjects of a subject area, and a domain entity instance model 108 corresponding to an instance of a subject in a subject area. Further, the domain entity meta model 102 is configured to specify the general structure of the entities in the subject area. The general structure of the entities may define the structure required for specifying any component of interest, for example, a component's part, features (geometric or functional), requirements, constraints, etc. Further, the domain entity model 104 is configured to specify a specific domain entity as an instance of the domain entity meta model 102, for example, the model of a specific component such as Gear as an instance of the component meta model. Furthermore, the domain entity instance meta model 106 is configured to specify the general structure of entity instances in the subject area, for example, the component instance meta model, which defines the structure required for specifying any component instance of interest, i.e. a specific gear under design. In this respect, an entity instance may have to conform to the specification of the corresponding entity, therefore there may be a specification relationship between the domain entity instance meta model and the domain entity meta model. Further, the domain entity instance model 108 is configured to specify instances of the domain entities of the domain entity model 104, may be stored in terms of the structure specified by the domain entity instance meta model 106. For example, a specific gear under design conforming to the gear component model.

In another implementation, the subject implementation module 522 is further configured to include an interface of the subject with the computational platform through the subject integration layer. In this respect, the interface of the subject, including the instances of components, materials, manufacturing processes, phenomenon, and simulation tool, provides a constraint where the feature value and the feature may only be associated when the corresponding component instances and the component are associated. Further, the subject implementation module 522 is further configured to include database schema, object relational mapping, transaction management, and cache management through the subject information interaction layer.

In another implementation, the GUI modelling module 524 is further configured to generate the GUI screens based on a view model, a mapping between the view model and screen elements, a mapping between the view model and a platform service messages, and the set of rendering rules to identify the screen elements from the domain entities and platform services. In this respect, the GUI screens generation is based on a view model, a mapping between the view model and screen elements, a mapping between the view model and a platform service messages, and the set of rendering rules to identify the screen elements from the domain entities and platform services. Further, the GUI modelling module 524 is further configured to generate, automatically, the GUI screens using a set of rendering rules stored in the memory 514, which identify appropriate screen elements given the global state ontology elements and services. For example, the rendering rules may specify 'Parameter' objects that may be rendered using Text Boxes, and Services may be invoked on Button click. Therefore, by using these rules, the view model, screen elements and appropriate mappings may be, automatically, generated.

In another implementation, the tool integration module 526 is further configured to integrate the external simulation tools with the computational platform by reading data from the model elements in a global state ontology and preparing the inputs in a user determined format on said external simulation tools through the generated simulation tool adapters.

In another implementation, the tool integration module 526 is further configured to integrate said external simulation tools with the computational platform by reading the output generated by said external simulation tools and populate the model elements in the global state ontology through the generated simulation tool adapters.

Figure 6:
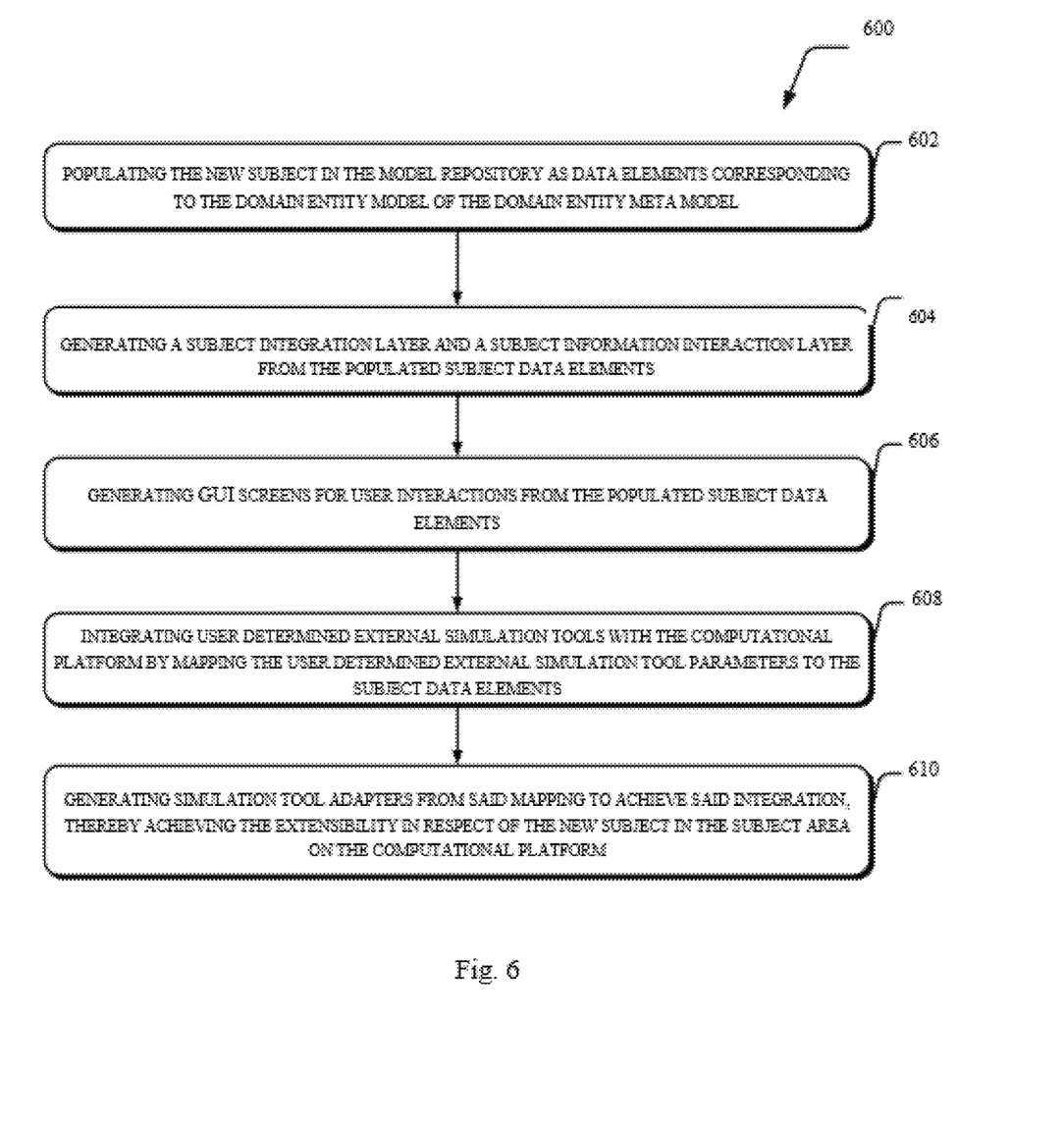
FIG. 6 illustrates a method for implementing extensibility of computational design and modelling of subject area on a computational platform in respect of a new subject in a subject area through a modelling schema, according to an implementation of the present disclosure.

FIG. 6 illustrates a method 600 for implementing, on a computer comprising a processor and a model repository, extensibility of computational design and modelling of subject areas on a computational platform in respect of a new subject in a subject area through a modelling schema according to an embodiment of the present subject matter. The method 600 may be described in the general context of computer executable instructions. Generally, computer executable instructions can include routines, programs, objects, components, data structures, procedures, and modules, functions, which perform particular functions or implement particular abstract data types. The method 600 may also be practiced in a distributed computing environment where functions are performed by remote processing devices that are linked through a communication network. In a distributed computing environment, computer executable instructions may be located in both local and remote computer storage media, including memory storage devices.

The order in which the method 600 is described is not intended to be construed as a limitation, and any number of the described method blocks can be combined in any order to implement the method 600, or alternative method. Additionally, individual blocks may be deleted from the method 600 without departing from the spirit and scope of the subject matter described herein. Furthermore, the method 600 can be implemented in any suitable hardware, software, firmware, or combination thereof. In an example, the method 600 may be implemented in a computing system, such as a model driven computing system 602.

Referring to method 600, at block 602, populating the new subject in the model repository as data elements corresponding to the domain entity model of the domain entity meta model is disclosed. In an implementation, the domain modelling module is configured to define the new subject in the model repository by populating data elements corresponding to the domain entity model of the domain entity meta model.

At block 604, generating a subject integration layer and a subject information interaction layer from the populated subject data elements is disclosed. In an implementation, the subject implementation module is configured to generate a subject integration layer and a subject information interaction layer from the populated subject data elements.

At block 606, generating GUI screens for user interactions from the populated subject data elements is disclosed. In an implementation, the GUI modelling module is configured to generate GUI screens, based on rendering rules stored in said memory, for user interactions from the populated subject data elements.

At block 608, integrating user determined external simulation tools with the computational platform by mapping the user determined external simulation tool parameters to the subject data elements is disclosed. In an implementation, the tool integration module is configured to integrate user determined external simulation tools with the computational platform by mapping the user determined external simulation tool parameters to the subject data elements.

At block 610, generating simulation tool adapters from said mapping to achieve said integration is disclosed. In an implementation, the tool integration module is further configured to generate simulation tool adapters from said mapping to achieve said integration, thereby achieve the extensibility in respect of the new subject in the subject area on the computational platform.

Although implementations for selecting a material, a material structure, a suitable geometry and a process for manufacturing of a component have been described in language specific to structural features and/or method, it is to be understood that the appended claims are not necessarily limited to the specific features or method described. Rather, the specific features and method are disclosed as exemplary implementations for determining human activity using the smart meter data.

TECHNICAL ADVANCEMENTS

The technical advancements offered by the present disclosure include the realization of:

A model driven computational platform for integrated design of materials, manufacturing processes and products which accelerates the development of new engineering solutions.

A model driven computational platform for integrated design of materials, manufacturing processes and products which eliminates the disadvantages associated with non-model based implementation techniques.

A model driven computational platform for integrated design of materials, manufacturing processes and products which provides the freedom to add support for new materials, products and manufacturing processes.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. Therefore, while the embodiments herein have been described in terms of preferred embodiments, those skilled in the art will recognize that the embodiments herein can be practiced with modification within the spirit and scope of the embodiments as described herein.

What is claimed is:

1. A method to implement extensibility of computational design and modelling of a subject area on a computational platform of a new subject in the subject area, the method comprising:
implementing the extensibility of the subject area through a modelling schema, wherein the subject area comprises components, materials, manufacturing processes, phenomenon, and simulation model, and the new subject comprises instance of the subject area comprising the components, the materials, the manufacturing processes, the phenomenon and the simulation model, wherein the modelling schema includes a domain entity meta model corresponding to the subject area, a domain entity model corresponding to each subject in the subject area, a domain entity instance model corresponding to an instance of a subject in the subject area, and a domain entity instance meta model corresponding to instances of subjects of the subject area;
populating, by a processor, the new subject in a model repository as subject data elements corresponding to the domain entity model of the domain entity meta model;
generating, by the processor, a subject integration layer and a subject information interaction layer from the populated subject data elements;
generating, by the processor, graphical user interface (GUI) screens for user interactions using a set of rendering rules which identify screen elements for given global state ontology elements from the populated subject data elements;
integrating, by the processor, user determined external simulation tools with the computational platform by reading data from the populated subject data elements in a global state ontology and preparing inputs in a user defined format of the external simulation tools; and
generating, by the processor, simulation tool adapters for reading output by the external simulation tools and repopulate the subject data elements in the global state ontology to achieve said integration, thereby achieving the extensibility in respect of the new subject in the subject area on the computational platform.

2. The method as claimed in claim 1, wherein the domain entity meta model specifies a general structure of entities in the subject area and the domain entity model specifies a specific domain entity as an instance of the domain entity meta model, wherein the general structure of the entities defines a structure required for specifying a component of interest comprising i) a part, ii) one or more features including geometric or functional features, iii) one or more requirements, and iv) one or more constraints associated with the component of interest.

3. The method as claimed in claim 1, wherein the domain entity instance meta model specifies a general structure of entity instances in the subject area and the domain entity instance model specifies instances of domain entities of the domain entity meta model, wherein the entity instances conform to specification of the domain entities, thereby establishing a relationship between the domain entity instance meta model and the domain entity meta model.

4. The method as claimed in claim 2, wherein the domain entity meta model provides a common language in terms of how the domain entity model is expressed, thereby establishing a relationship between the domain entity meta model and the domain entity model, wherein the common language is used to automate functions of the GUI screens generation and the external simulation tools integration.

5. The method as claimed in claim 1, wherein the subject integration layer comprises an interface with the computational platform, wherein the interface comprises instances of the components, the materials, the manufacturing processes, the phenomenon, and the simulation tool, and the subject information interaction layer comprises database schema, object relational mapping, transaction management, and cache management.

6. The method as claimed in claim 1, wherein the GUI screens generation is based on a view model, a mapping between the view model and screen elements, a mapping between the view model and a platform service messages, and the set of rendering rules to identify the screen elements for domain entities and platform services.

7. A system to implement extensibility of computational design and modelling of a subject area on a computational platform of a new subject in the subject area, the system comprising:
a processor;
a model repository;
a memory coupled with the processor, wherein the processor executes instructions stored in the memory, and wherein the instructions implement the extensibility of the subject area through a modelling schema, wherein the subject area comprises components, materials, manufacturing processes, phenomenon, and simulation model, and the new subject comprises instances of the subject area comprising the components, the materials, the manufacturing processes, the phenomenon and the simulation model, wherein the modelling schema includes a domain entity meta model corresponding to the subject area, a domain entity model corresponding to each subject in the subject area, a domain entity instance meta model corresponding to instances of subjects of the subject area, and a domain entity instance model corresponding to an instance of a subject in the subject area, and wherein the instructions configure the processor to:
define the new subject in the DA model repository by populating subject data elements corresponding to the domain entity model of the domain entity meta model;
generate a subject integration layer and a subject information interaction layer from the populated subject data elements;
generate graphical user interface (GUI) screens for user interactions using a set of rendering rules stored in said memory which identify screen elements for given global state ontology elements from the populated subject data elements;
integrate user determined external simulation tools with the computational platform by reading data from the populated subject data elements in a global state ontology and preparing inputs in a user defined format of the external simulation tools; and
generate simulation tool adapters for reading output by the external simulation tools and repopulate the subject data elements in the global state ontology to achieve said integration, thereby achieving the extensibility in respect of the new subject in the subject area on the computational platform.

8. The system as claimed in claim 7, wherein the domain entity instance meta model is configured to specify a general structure of entity instances in the subject area and the domain entity instance model is configured to specify instances of domain entities of the domain entity model, wherein the domain entity instance model has to conform to specification of a corresponding one of the domain entities.

9. The system as claimed in claim 7, wherein the domain entity instance meta model specifies a general structure of entity instances in the subject area and the domain entity instance model specifies instances domain entities of the domain entity meta model, wherein the instances have to conform to specification of the domain entities, thereby establishing a relationship between the domain entity instance meta model and the domain entity meta model.

10. The system as claimed in claim 7, wherein the subject integration layer comprises an interface with the computational platform, wherein the interface comprises instances of the components, the materials, the manufacturing processes, the phenomenon, and the simulation tool, and the subject information interaction layer comprises database schema, object relational mapping, transaction management, and cache management.

11. The system as claimed in claim 7, wherein the processor is further configured to generate the GUI screens based on a view model, a mapping between the view model and screen elements, a mapping between the view model and a platform service messages, and the set of rendering rules to identify the screen elements for domain entities and platform services.

* * * * *